(12) United States Patent
Kobayashi et al.

(10) Patent No.: US 10,317,981 B2
(45) Date of Patent: *Jun. 11, 2019

(54) DATA PROCESSING DEVICE AND DATA PROCESSING SYSTEM

(71) Applicant: Renesas Electronics Corporation, Tokyo (JP)

(72) Inventors: Soichi Kobayashi, Tokyo (JP); Akira Oizumi, Tokyo (JP); Yoshihiko Yasu, Tokyo (JP); Hiromi Notani, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/370,718

(22) Filed: Dec. 6, 2016

(65) Prior Publication Data
US 2017/0083080 A1    Mar. 23, 2017

Related U.S. Application Data

(63) Continuation of application No. 13/818,379, filed as application No. PCT/JP2010/065054 on Sep. 2, 2010, now Pat. No. 9,529,402.

(51) Int. Cl.
*G06F 1/3287* (2019.01)
*G06F 1/324* (2019.01)
(Continued)

(52) U.S. Cl.
CPC .............. *G06F 1/3287* (2013.01); *G06F 1/32* (2013.01); *G06F 1/3203* (2013.01); *G06F 1/324* (2013.01);
(Continued)

(58) Field of Classification Search
CPC ........ G06F 1/3287; G06F 1/32; G06F 1/3203; G06F 1/3206; G06F 1/3237; G06F 1/324; G11C 5/147; G05F 1/56
See application file for complete search history.

(56) References Cited

U.S. PATENT DOCUMENTS 4,031,482 A    6/1977   Tsurushima
5,511,013 A    4/1996   Tokieda et al.
(Continued)

FOREIGN PATENT DOCUMENTS

JP    70-28549 A       1/1995
JP    2000-305668 A    11/2000
(Continued)

OTHER PUBLICATIONS

Chinese Office Action dated Apr. 2, 2014, with English translation.
(Continued)

*Primary Examiner* — Jaweed A Abbaszadeh
*Assistant Examiner* — Gayathri Sampath
(74) *Attorney, Agent, or Firm* — McGinn I.P. Law Group, PLLC.

(57) ABSTRACT

A data processing device includes a load circuit including a central processing unit and operated by supplied electric power, a step-down power supply circuit stepping down an external power supply voltage and including an output node coupled to the load circuit, the step-down power supply circuit including a first step-down unit stepping down the external power supply voltage, and a bias current control circuit controlling a magnitude of bias current flowing through an auxiliary path from the output node to a ground, the auxiliary path is separate from a path to the load circuit, and a control circuit increasing the magnitude of the bias current, prior to a change of an operation state of the load circuit by which a relatively large change occurs to an amount of current consumed by the load circuit.

22 Claims, 9 Drawing Sheets

(51) Int. Cl.
*G06F 1/3206* (2019.01)
*G06F 1/3237* (2019.01)
*G06F 1/3234* (2019.01)
*G06F 1/3296* (2019.01)
*G06F 1/3203* (2019.01)
*G06F 1/32* (2019.01)
*G11C 5/14* (2006.01)
*G05F 1/56* (2006.01)

(52) U.S. Cl.
CPC .......... *G06F 1/3206* (2013.01); *G06F 1/3237* (2013.01); *G06F 1/3275* (2013.01); *G06F 1/3296* (2013.01); *G11C 5/147* (2013.01); *G05F 1/56* (2013.01); *Y02D 10/126* (2018.01); *Y02D 10/128* (2018.01); *Y02D 10/172* (2018.01); *Y02D 50/20* (2018.01)

(56) References Cited

U.S. PATENT DOCUMENTS

| | | |
|---|---|---|
| 5,811,861 A | 9/1998 | Nunokawa |
| 6,204,654 B1 | 3/2001 | Miranda |
| 6,252,384 B1 | 6/2001 | Arai et al. |
| 6,424,128 B1 | 7/2002 | Hiraki et al. |
| 6,662,084 B2 | 12/2003 | Hiraki et al. |
| 6,667,603 B2 | 12/2003 | Hiraki et al. |
| 6,683,767 B2 | 1/2004 | Ito et al. |
| 6,737,839 B2 | 5/2004 | Hiraki et al. |
| 6,768,370 B2 | 7/2004 | Takahashi et al. |
| 7,177,123 B2 | 2/2007 | Ito et al. |
| 7,257,720 B2 | 8/2007 | Ichien et al. |
| 7,307,469 B2 | 12/2007 | Yamada et al. |
| 7,417,838 B2 | 8/2008 | Ito et al. |
| 7,468,624 B2 | 12/2008 | Yamada et al. |
| 7,630,178 B2 | 12/2009 | Ito et al. |
| 7,881,026 B2 | 2/2011 | Ito et al. |
| 8,139,327 B2 | 3/2012 | Ito et al. |
| 8,183,899 B2 | 5/2012 | Kanno et al. |
| 8,350,595 B2 | 1/2013 | Kanno et al. |
| 2001/0010457 A1 | 8/2001 | Kobayashi et al. |
| 2002/0125922 A1 | 9/2002 | Kawagoshi |
| 2004/0174148 A1 | 9/2004 | Hiraki et al. |
| 2005/0033998 A1 | 2/2005 | Honda et al. |
| 2007/0150768 A1 | 6/2007 | Ichien et al. |
| 2008/0052549 A1 | 2/2008 | Ichien et al. |
| 2008/0094043 A1 | 4/2008 | Inomoto |
| 2011/0122780 A1* | 5/2011 | Nieminen ......... H04W 52/0232 370/252 |
| 2011/0269463 A1* | 11/2011 | Wang .................. H04W 76/046 455/436 |
| 2012/0113552 A1 | 5/2012 | Ito et al. |

FOREIGN PATENT DOCUMENTS

| | | |
|---|---|---|
| JP | 2001-211640 A | 8/2001 |
| JP | 2001-216779 A | 8/2001 |
| JP | 2002-083872 A | 3/2002 |
| JP | 2003-124795 A | 4/2003 |
| JP | 2003-142999 A | 5/2003 |
| JP | 2004-171445 A | 6/2004 |
| JP | 2005-071320 A | 3/2005 |
| JP | 2006-039816 A | 2/2006 |
| JP | 2006-293802 A | 10/2006 |
| JP | 2006-318192 A | 11/2006 |
| JP | 2008-310616 A | 12/2008 |
| JP | 2010-118746 A | 5/2010 |
| JP | 4711287 B2 | 6/2011 |

OTHER PUBLICATIONS

Notice of Grounds for Rejection dated Dec. 3, 2013, with English translation.
International Search Report (ISR) (PCT Form PCT/ISA/210) dated Nov. 22, 2010, in PCT/JP2010/065054.
U.S. Office Action dated Mar. 10, 2015 in U.S. Appl. No. 13/818,379.
U.S. Office Action dated Sep. 14, 2015 in U.S. Appl. No. 13/818,379.
U.S. Office Action dated Mar. 22, 2016 in U.S. Appl. No. 13/818,379.
U.S. Notice of Allowance dated Aug. 17, 2016 in U.S. Appl. No. 13/818,379.

* cited by examiner

DATA PROCESSING DEVICE AND DATA PROCESSING SYSTEM

CROSS-REFERENCE TO RELATED APPLICATIONS

The present application is a Continuation Application of U.S. patent application Ser. No. 13/818,379, filed on Feb. 22, 2013, which is based on International Application PCT/JP2010/065054, filed on Sep. 2, 2010, the entire contents of which are hereby incorporated by reference.

TECHNICAL FIELD

The present invention relates to a data processing device and a data processing system, and particularly to a data processing device having a central processing unit and to a data processing system in which the data processing device is used.

BACKGROUND ART

Recently, with miniaturization of the data processing device including a central processing unit (CPU) configured on a semiconductor substrate, problems of a decrease of the breakdown voltage of transistors and an increase of the off-state leakage current have arisen.

Meanwhile, apparatuses using the data processing device are required to operate with an operating voltage, which is supplied to the data processing device, in a wide voltage range from a relatively high voltage (on the order of 5 V) to a relatively low voltage (3 V) and to a still lower voltage (1.8 V) in consideration of reduction of the power consumption, because of external factors (such as communication standards).

In order to operate in a wide voltage range, the data processing device has a plurality of power supply circuits (regulators) in the data processing device to generate an internal operating voltage from an externally supplied voltage and supply the generated voltage to internal functional blocks (see PTL 1), and determines the operation state of the power supply circuits in accordance with a signal based on the operation mode of the central processing unit (see PTL 2).

Also, in order to reduce the power consumption, the data processing device uses, as its internal voltage, a voltage generated by lowering an externally supplied voltage, and performs an intermittent operation in which a transition to a low power consumption state is made while operation is unnecessary. In the low power consumption state, the clock and the power supply voltage that are supplied to internal functional blocks of the data processing device are controlled. Specifically, the frequency of the clock to be supplied is lowered, the power supply voltage to be supplied is decreased, or supply of the clock and/or the power supply voltage is stopped (see PTL 3 and PTL 4).

CITATION LIST

Patent Literature

PTL 1: Japanese Patent Laying-Open No. 2002-83872
PTL 2: Japanese Patent Laying-Open No. 2001-211640
PTL 3: Japanese Patent Laying-Open No. 7-28549
PTL 4: Japanese Patent Laying-Open No. 2010-118746

SUMMARY OF INVENTION

Technical Problem

In the case where such a step-down power supply circuit is incorporated to generate an internal operating voltage, the self power consumption, namely the power consumed by the step-down power supply circuit itself hinders reduction of the power consumption.

For example, in a step-down power supply circuit shown in FIG. 2 of PTL 1, a driver MOS transistor 40 which lowers an externally supplied voltage to an internal operating voltage is designed, in order to reduce the self power consumption in the operation state in which the power consumption is maximum, so that the ON resistance in this operation state is minimum.

Also, in order to ensure adequate driving ability even when the externally supplied voltage is a low voltage, the width of the gate electrode of the MOS transistor 40 is increased and, in order to apply a higher voltage than an internal operating voltage to the gate electrode of the output MOS transistor 40, the gate insulating film is thickened. Accordingly, the capacity of the gate electrode of the driver MOS transistor 40 is increased. In the case where the intermittent operation is performed and a transition is made from a low power consumption state to a normal operation state, it is a problem that increase of the voltage level of the internal operating voltage to be supplied to internal functional blocks is delayed. On the contrary, in the case where a transition is made from the normal operation state to the low power consumption state, it is a problem that draw of the charge having been supplied to the internal functional blocks, to the ground potential, is delayed, resulting in an unexpected increase of the internal supply voltage.

An object of the present invention is therefore to provide a data processing device and a data processing system that are capable of quickly raising the voltage level of an internal operating voltage to be supplied to internal functional blocks (load circuit) when the intermittent operation is performed.

Solution to Problem

A data processing device according to an embodiment of the present invention includes: a load circuit including a central processing unit and operated by supplied electric power; and a step-down power supply circuit stepping down an external power supply voltage and having an output node connected to the load circuit. The step-down power supply circuit includes: a first step-down unit stepping down the external power supply voltage; and a bias current control circuit controlling a magnitude of bias current flowing through an auxiliary path from the output node to a ground. The data processing device further includes a control unit increasing the magnitude of the bias current, prior to a change of an operation state of the load circuit by which a relatively large change occurs to an amount of current consumed by the load circuit.

Advantageous Effects of Invention

In accordance with an embodiment of the present invention, the voltage level of an internal operating voltage to be supplied to internal functional blocks (load circuit) when the intermittent operation is performed can quickly be raised.

DESCRIPTION OF EMBODIMENTS

Regarding embodiments of the present invention, a description will be given of an example where, prior to a change of the operation state accompanied by a relatively large change of the amount of current necessary for the operation of functional blocks such as central processing unit in a data processing device, the magnitude of bias current is controlled that is used for increasing the amount of current which an output driver MOS transistor of a step-down power supply circuit can flow.

Embodiments of the present invention will hereinafter be described with reference to the drawings.

First Embodiment

Figure 1:
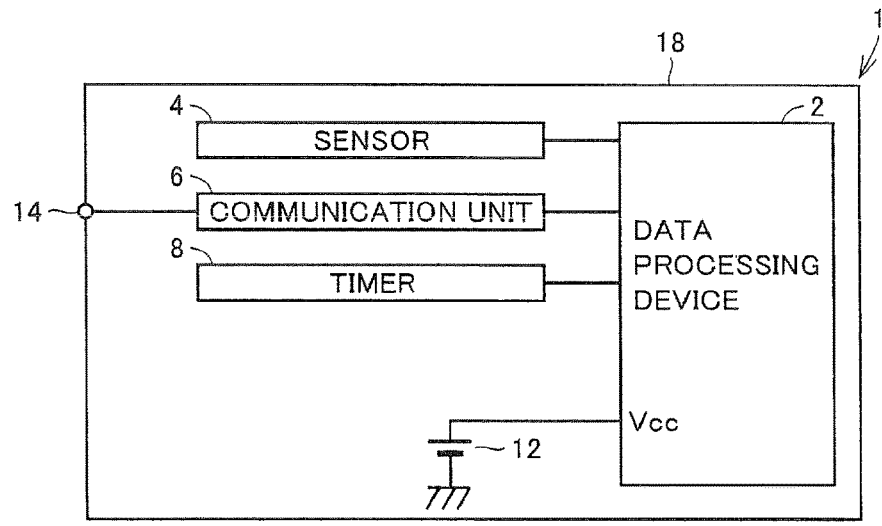
FIG. 1 is a diagram showing an example of the data processing system having the data processing device.

FIG. 1 is a diagram showing an example of the data processing system having the data processing device.

Referring to FIG. 1, a data processing system 1 includes a printed circuit board 18, as well as a data processing device 2, a sensor 4, a communication unit 6, a timer 8, and a battery 12 that are mounted on printed circuit board 18. To data processing device 2, the voltage of battery 12 is supplied as power supply voltage Vcc.

Figure 2:
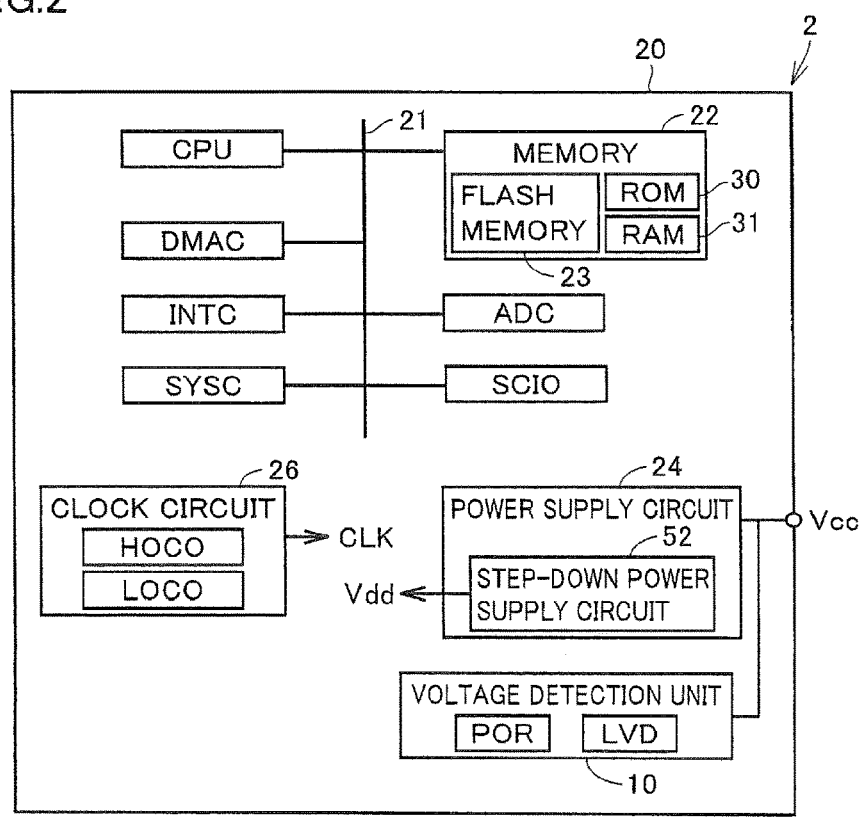
FIG. 2 is a schematic configuration diagram of the data processing device having a central processing unit.

FIG. 2 is a schematic configuration diagram of the data processing device having a central processing unit CPU. FIG. 2 shows, in addition to components of a common microcomputer, functional units specific to the present invention.

Referring to FIG. 2, data processing device 2 includes a central processing unit CPU, a memory 22, a bus 21 transferring data and addresses, a data transfer unit (Direct Memory Access Controller) DMAC, an analog-to-digital conversion unit ADC, an interrupt controller INTC, a serial communication unit SCIO, a system controller SYSC, a clock circuit 26, a power supply circuit 24, and a voltage detection unit 10.

Memory 22 includes a flash memory 23, a ROM (Read Only Memory) 30, and a RAM (Random Access Memory) 31. Memory 22 stores data and programs.

Central processing unit CPU successively executes programs stored in memory 22 and controls the operation of data processing device 2 as a whole.

Serial communication unit SCIO stores externally input data in memory 22.

The analog-to-digital conversion unit (ADC) converts an externally input analog signal to a digital value and stores the digital value in memory 22.

Data transfer unit DMAC controls data transfer through bus 21, when serial communication unit SCIO or analog-to-digital conversion unit ADC stores digital data in memory 22.

Interrupt controller INTC receives an interrupt signal issued by an external or internal functional unit, and causes interruption to central processing unit CPU. Central processing unit CPU performs processing in accordance with the type of interruption.

Clock circuit 26 includes a plurality of clock sources including a low-speed clock oscillator LOCO and a high-speed clock oscillator HOCO. Clock circuit 26 generates operation clock CLK for data processing device 2 and supplies, to each functional unit in data processing device 2, the operation clock of a frequency appropriate for the functional unit.

Power supply circuit 24 lowers or raises externally supplied power supply voltage Vcc and supplies the resultant voltage to each component in the data processing device. Power supply circuit 24 includes a step-down power supply circuit 52 which steps down externally supplied power supply voltage Vcc to generate internal operating voltage Vdd for example.

Voltage detection unit 10 has a power-on reset circuit POR generating a reset signal which triggers a power-on reset operation, in response to a voltage change of externally supplied power supply voltage Vcc, and has a low voltage detect circuit LVD generating an interrupt signal or a reset signal in response to a voltage decrease of externally supplied power supply voltage Vcc.

System controller SYSC controls the operation of the data processing device as a whole. System controller SYSC controls supply of the clock and the power supply voltage to each of functional blocks (namely load circuit) in the data processing device including central processing unit CPU. System controller SYSC also controls step-down power supply circuit 52.

Referring to FIGS. 1 and 2, sensor 4 generates an analog signal to be input to analog-to-digital conversion unit ADC.

Communication unit 6 controls data communication with devices external to the system through a terminal 14, and inputs data to serial communication unit SCIO or receives data from serial communication unit SCIO.

Timer 8 issues an interrupt signal to data processing device 2, in accordance with passage of time which is set by data processing device 2.

To data processing device 2, operating power supply voltage Vcc is supplied from battery 12 which is externally connected to data processing device 2.

<Step-Down Power Supply Circuit>

Figure 3:
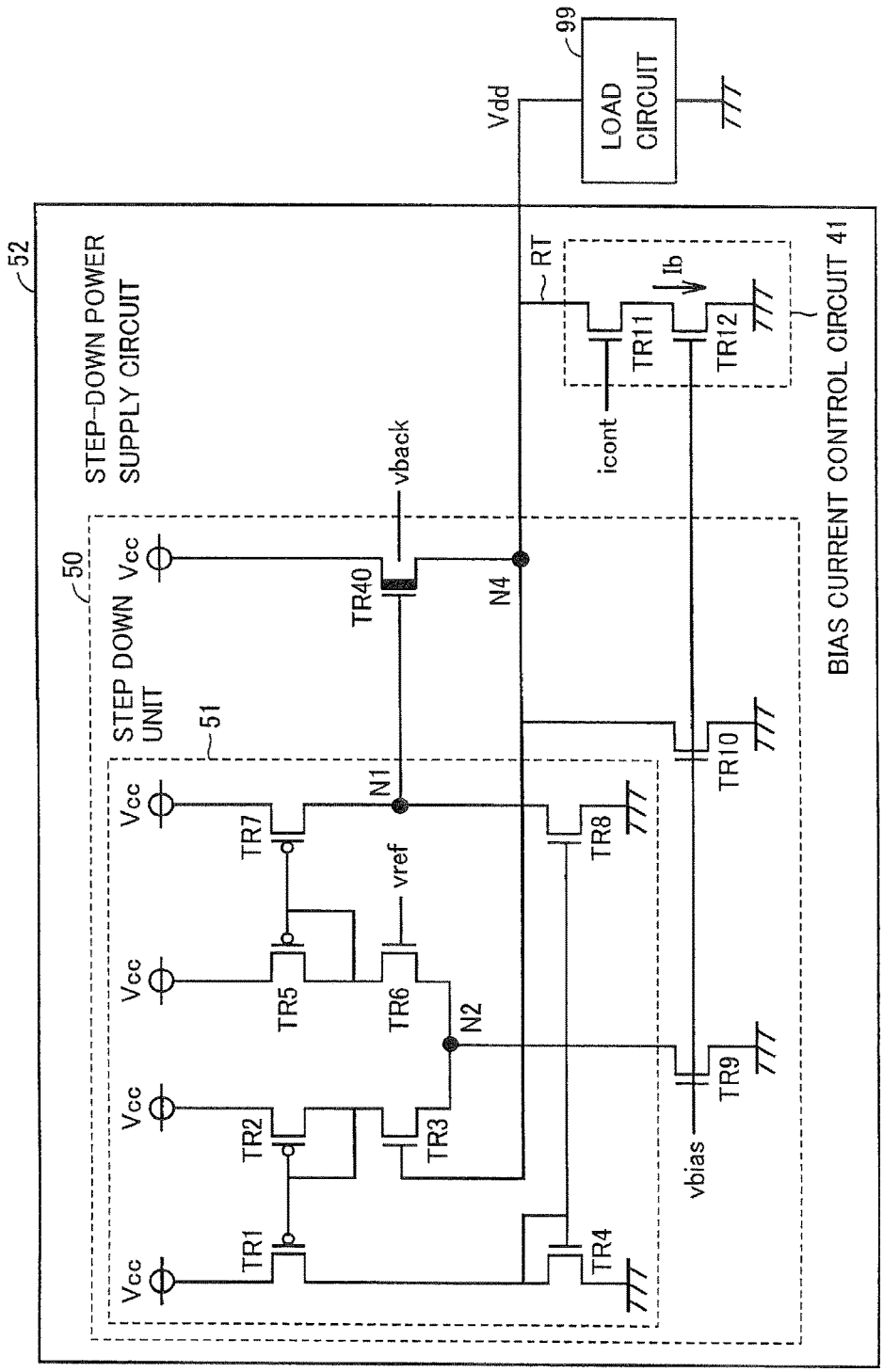
FIG. 3 is a diagram showing a step-down power supply circuit of a first embodiment.

FIG. 3 is a diagram showing the step-down power supply circuit of the first embodiment.

Referring to FIG. 3, this step-down power supply circuit 52 includes a step down unit 50. Step down unit 50 has a differential operational amplifier 51.

Differential operational amplifier 51 is constituted of P-channel MOS transistors TR1, TR2, TR5, TR7 and N-channel MOS transistors TR4, TR3, TR6, TR8. N-channel MOS transistor TR6 has its gate to which reference voltage Vref is input. N-channel MOS transistor TR3 has its gate to which stepped-down voltage Vdd of an output node N4 of step-down power supply circuit 52 is input.

Step down unit 50 further includes an N-channel MOS transistor TR9 provided between a ground GND and a connection node N2 connecting N-channel MOS transistor TR3 and N-channel MOS transistor TR6 to each other. Step down unit 50 further includes an N-channel MOS transistor TR10 provided between output node N4 of step-down power supply circuit 52 and ground GND.

Step down unit 50 further includes a large-sized output MOS transistor TR40 provided between an external power supply voltage node Vcc and output node N4 of step-down power supply circuit 52. Output MOS transistor TR40 is configured as an N-channel DMOS (double-diffused MOS) transistor. An output node N1 of differential operational amplifier 51 is connected to the gate of output MOS transistor TR40. Differential operational amplifier 51 applies, to the gate of output MOS transistor TR40, a voltage according to a potential difference between reference voltage Vref and stepped-down voltage Vdd.

Output node N4 of step-down power supply circuit 52 is connected to a load circuit 99 and stepped-down voltage Vdd of output node N4 is supplied to load circuit 99.

Step-down power supply circuit 52 includes a bias current control circuit 41 provided on an auxiliary path RT arranged in parallel with the path between output node N4 and load circuit 99. Namely, between external power supply voltage node Vcc and ground GND, the drain-to-source path of output MOS transistor TR40 and bias current control circuit 41 are connected in series.

Bias current control circuit 41 includes, between output node N4 of step-down power supply circuit 52 and ground GND, an N-channel MOS transistor TR11 and an N-channel MOS transistor TR12 connected in series.

To the gate of N-channel MOS transistor TR11, bias control signal icont is input. The level of bias control signal icont is activated to "H" level when a transition is made from the normal operation state to the low power consumption state and when a transition is made from the low power consumption state to the normal operation state.

To the gate of N-channel MOS transistor TR9, the gate of N-channel MOS transistor TR10, and the gate of N-channel MOS transistor TR12, control signal vbias is input. Control signal vbias is "H" level in the whole period of the normal operation state as well as a starting period and an ending period of the low power consumption state, and is "L" level except for the starting and ending periods of the low power consumption state.

Therefore, when a transition is made from the normal operation state to the low power consumption state and when a transition is made from the low power consumption state to the normal operation state, namely when a change of the operation state occurs which is accompanied by a relatively large change of the amount of current necessary for the operation of load circuit 99, bias current Ib which flows in auxiliary path RT from output node N4 to ground GND through bias current control circuit 41 increases.

<Operation Timing of Step-Down Power Supply Circuit 52>

Figure 4:
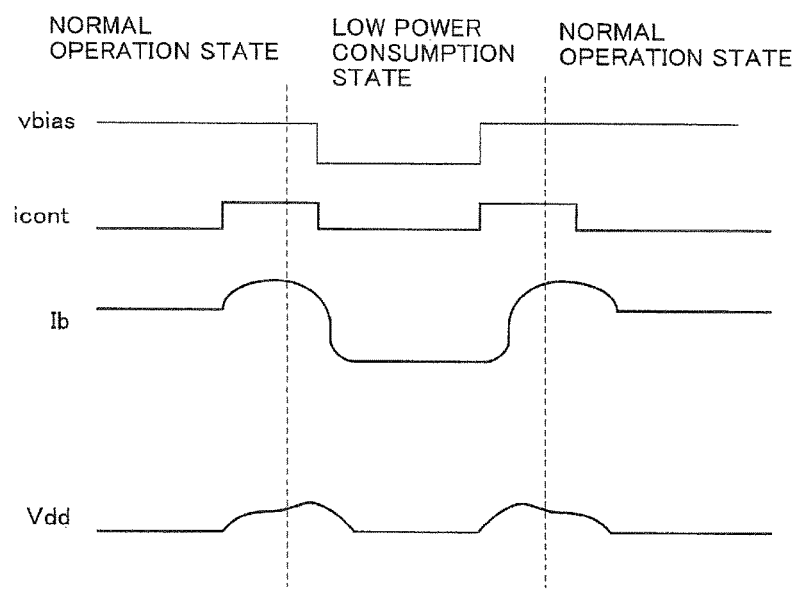
FIG. 4 is a diagram for illustrating an operation, in a first embodiment, when the data processing device makes a transition from a normal operation state to a low power consumption state and when it makes a transition from the low power consumption state to the normal operation state.

FIG. 4 is a diagram for illustrating an operation when the data processing device makes a transition from the normal operation state to the low power consumption state and when it makes a transition from the low power consumption state to the normal operation state.

Referring to FIG. 4, the normal operation state is a state in which the power consumption is relatively high. In the normal operation state, central processing unit CPU operates in synchronization with a clock signal of 50 MHz which is output from high-speed clock oscillator HOCO. Other functional blocks in data processing device 2 also operate.

The low power consumption state is a state in which the power consumption is relatively low. In the low power consumption state, supply of the clock signal to central processing unit CPU is stopped.

(a) As to Transition from Normal Operation State to Low Power Consumption State

In the case where load circuit 99 including central processing unit CPU for example makes a transition from the normal operation state to the low power consumption state, system controller SYSC activates bias control signal Icont for bias current control circuit 41 to "H" level, prior to the transition of the state.

In response to activation of bias control signal Icont, bias current control circuit 41 increases the amount of current flowing from output node N4 of step-down power supply circuit 52 to ground GND.

Accordingly, the voltage of output node N4 decreases. Meanwhile, the amount of current flowing to load circuit 99 including central processing unit CPU for example is relatively large and the ON resistance of the drain-to-source path of output MOS transistor TR40 has sufficiently decreased. The decrease of the voltage of output node N4 is therefore a limited decrease and almost no change occurs to the voltage applied to the gate electrode of output MOS transistor TR40. Under this condition, load circuit 99 including central processing unit CPU for example makes a transition to the low power consumption state. Thus, supply of current to load circuit 99 including central processing unit CPU for example becomes unnecessary. Due to this, electrical charge stays on output node N4. The stay of the charge, however, increases the amount of current that can be discharged through bias current control circuit 41 to ground GND. An increase of the voltage of output node N4 can therefore be prevented.

At the time when the transition of load circuit 99 including central processing unit CPU for example to the low power consumption state has been completed and a predetermined time which is taken for eliminating the stay of the charge on output node N4 has passed, system controller SYSC sets control signal vbias to "L" level and inactivates bias control signal Icont for bias current control circuit 41 to "L" level.

Even when load circuit 99 including central processing unit CPU for example has made the transition to the low power consumption state, there are still functional blocks such as interrupt controller INTC which are performing respective operations and therefore a predetermined amount of current is consumed by load circuit 99 as a whole. After bias control signal Icont for bias current control circuit 41 is inactivated, step-down power supply circuit 52 supplies a predetermined amount of current which is necessary for load circuit 99, and applies, to the gate electrode of output MOS transistor TR40, a voltage which is enough to keep potential Vdd of output node N4 constant.

(b) As to Transition from Low Power Consumption State to Normal Operation State

In the case where load circuit 99 including central processing unit CPU for example makes a transition from the low power consumption state to the normal operation state, system controller SYSC sets control signal vbias to "H" level and activates bias control signal Icont for bias current control circuit 41 to "H" level, prior to the transition of the state.

In response to activation of bias control signal Icont, bias current control circuit 41 increases the amount of current flowing from output node N4 of step-down power supply circuit 52 to ground GND. To the gate electrode of output MOS transistor TR40, a voltage is applied which is enough to supply a predetermined amount of current necessary for load circuit 99 in the low power consumption state. Therefore, as bias current Ib which is flown by bias current control circuit 41 to ground GND increases, the voltage of output node N4 accordingly decreases. In response to the decrease of the voltage of output node N4, differential operational amplifier 51 increases the voltage applied to the gate electrode of output MOS transistor TR40 to thereby increase the amount of current flowing in output MOS transistor TR40. After this condition is reached, even when load circuit 99 including central processing unit CPU for example makes a transition to the normal operation state, output MOS transistor TR40 can supply current which is necessary for load circuit 99 including central processing unit CPU for example. A decrease of the voltage of output node N4 can therefore be prevented.

<Operation Timing of Data Processing System>

Figure 5:
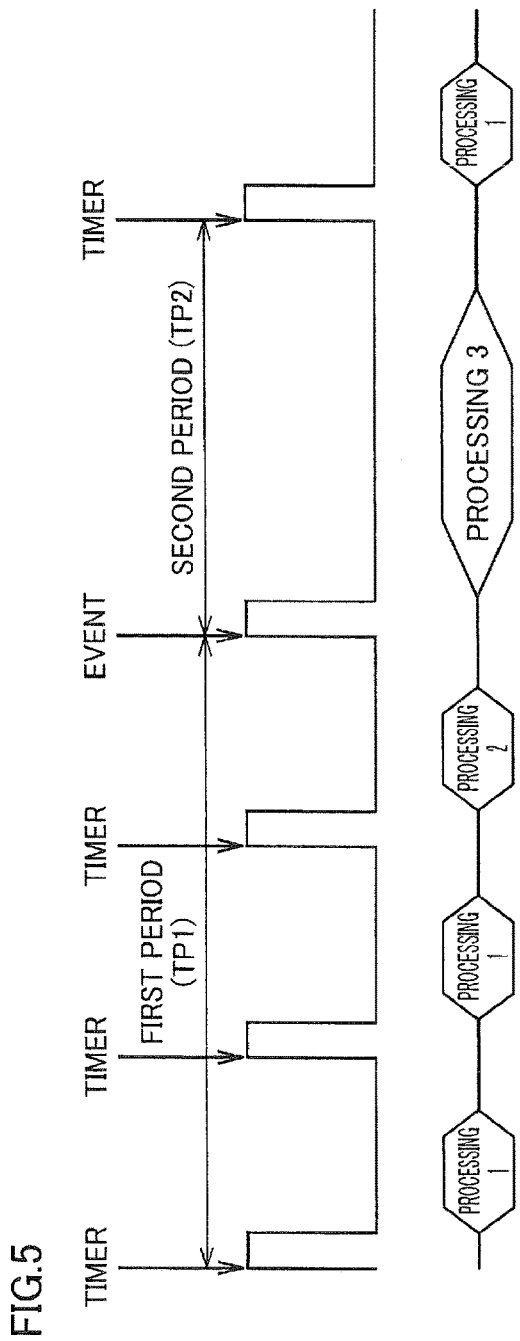
FIG. 5 is a diagram showing the operation timing of the data processing system.

FIG. 5 is a diagram showing the operation timing of the data processing system.

Referring to FIGS. 2 and 5, in a first period TP1, data processing device 2 is repeatedly booted at regular time intervals by timer 8 and makes a transition to the low power consumption state after performing predetermined processing. In a second period triggered by occurrence of a predetermined event, processing appropriate for this event is performed.

The data processing system operating in this manner is for example a data processing system used in an electricity meter.

Specifically, at every predetermined time (24 hours for example), this data processing system records (processing time: 0.1 second for example), or notifies a power company of, the amount of power consumption. The data processing system then notifies the power company of the amount of power consumption every month (processing time: 1 second for example).

In first period TP1, interrupt controller INTC receives a notification from timer 8 and issues a notification of interrupt to central processing unit CPU. Receiving the notification of interrupt, central processing unit CPU makes a transition from the low power consumption state to the normal operation state. In this normal operation state, central processing unit CPU performs processing for recording the amount of power consumption (Processing 1) and performs processing for making a notification of the amount of power consumption which is recorded at every few minutes (Processing 2).

In second period TP2, in response to occurrence of a predetermined event such as a request from a user, interrupt controller INTC issues a notification of interrupt to central processing unit CPU. Receiving the notification of interrupt, central processing unit CPU makes a transition from the low power consumption state to the normal operation state. In this normal operation state, central processing unit CPU performs processing for making a notification of the recorded amount of power consumption of one month (Processing 3), or performs processing for updating a control program.

<Transition from Low Power Consumption State to Normal Operation State>

Figure 6:
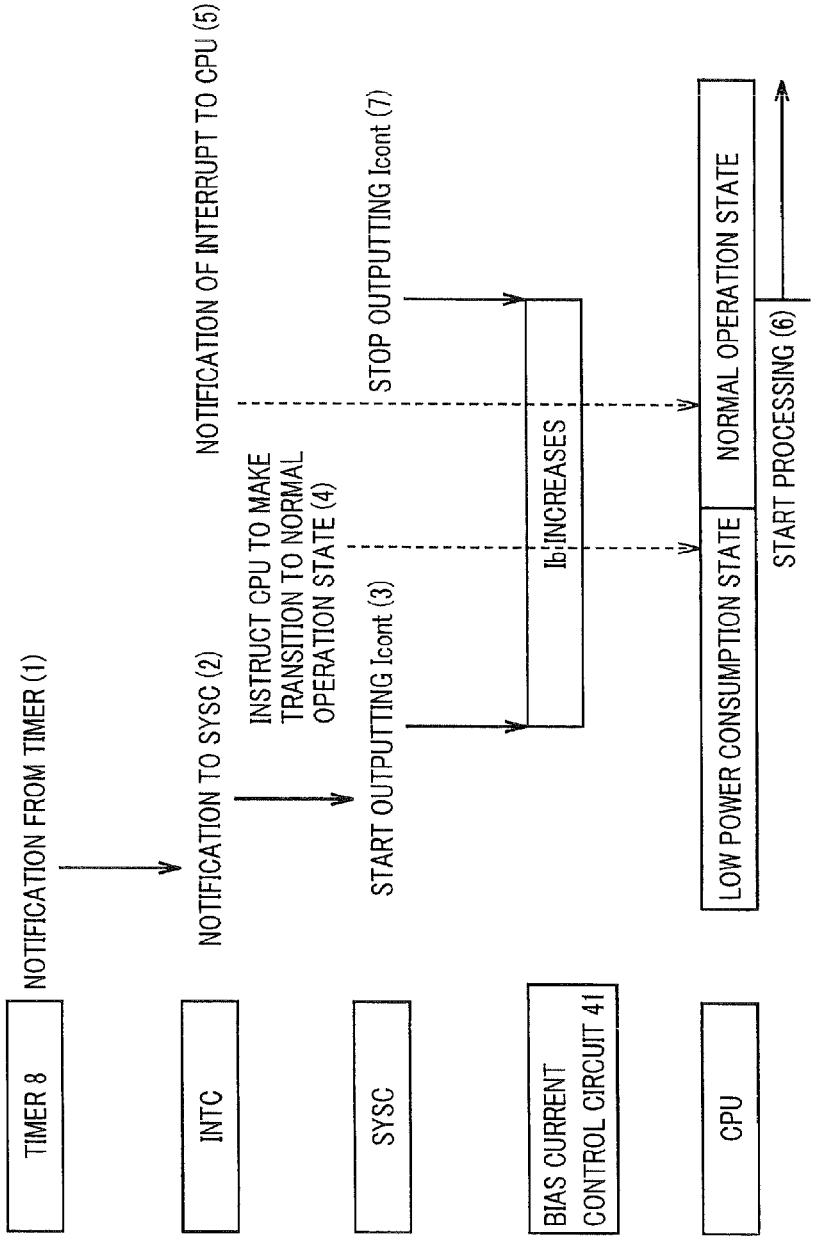
FIG. 6 is a diagram for illustrating an operation when the data processing system makes a transition from the low power consumption state to the normal operation state.

FIG. 6 is a diagram for illustrating an operation when the data processing system makes a transition from the low power consumption state to the normal operation state.

First, receiving a notification from timer 8 (indicated by (1)), interrupt controller INTC notifies system controller SYSC of an instruction to cause central processing unit CPU to make a transition from the low power consumption state to the normal operation state (indicated by (2)).

In response to this notification from interrupt controller INTC, system controller SYSC starts outputting bias control signal Icont to bias current control circuit 41. Namely, it activates the bias control signal to "H" level (indicated by (3)).

System controller SYSC waits for a predetermined time until the amount of current which can be flown by output MOS transistor TR40 of step-down power supply circuit 52 increases, and thereafter issues, to central processing unit CPU, an instruction to make a transition to the normal operation state (indicated by (4)).

In response to completion of the transition of central processing unit CPU to the normal operation state, interrupt controller INTC issues a notification of interrupt to central processing unit CPU (indicated by (5)).

In response to the notification of interrupt from interrupt controller INTC, central processing unit CPU starts processing (indicated by (6)).

System controller SYSC waits for a predetermined time until the transition of central processing unit CPU to the normal operation state is completed and occurrence of a decrease of the voltage of output node N4 of step-down power supply circuit 52 can be prevented, and then stops outputting bias control signal Icont to bias current control circuit 41, namely inactivates the bias control signal to "L" level.

<Transition from Normal Operation State to Low Power Consumption State>

Figure 7:
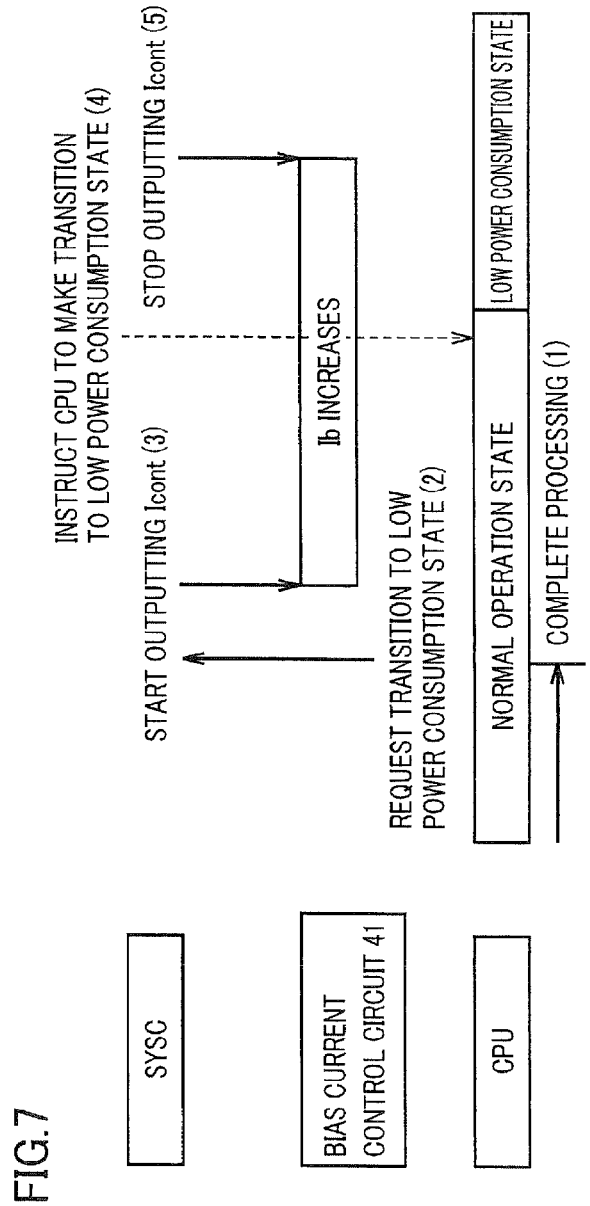
FIG. 7 is a diagram for illustrating an operation when the data processing system makes a transition from the normal operation state to the low power consumption state.

FIG. 7 is a diagram for illustrating an operation when the data processing system makes a transition from the normal operation state to the low power consumption state.

When central processing unit CPU completes its processing (indicated by (1)), central processing unit CPU requests system controller SYSC to cause a transition to the low power consumption state (indicated by (2)).

In response to this request from central processing unit CPU, system controller SYSC starts outputting bias control signal Icont to bias current control circuit 41 (namely activates the bias control signal to "H" level) to thereby increase the amount of bias current Ib that bias current control circuit 41 can flow to ground GND (indicated by (3)).

After this, system controller SYSC issues an instruction, to central processing unit CPU, to make a transition to the low power consumption state (indicated by (4)).

Then, after a predetermined time has passed that is taken for eliminating the stay of the charge which occurred due to stoppage of the operation of central processing unit CPU, system controller SYSC stops outputting bias control signal Icont to bias current control circuit 41 (namely inactivates the bias control signal to "L" level) (indicated by (5)).

As seen from the foregoing, in accordance with the first embodiment, when a transition is made from the normal operation state to the low power consumption state and when a transition is made from the low power consumption state to the normal operation state, the bias current flowing in the auxiliary path which is separate from the path to the load circuit is increased, prior to the transition, and stops the increase of the bias current after a predetermined time from the transition. Accordingly, in accordance with the internal operation state of the load circuit, current which is necessary for the load circuit can be supplied at an appropriate timing, and an unexpected decrease or increase of the voltage supplied to the load circuit can be prevented.

Second Embodiment

Figure 8:
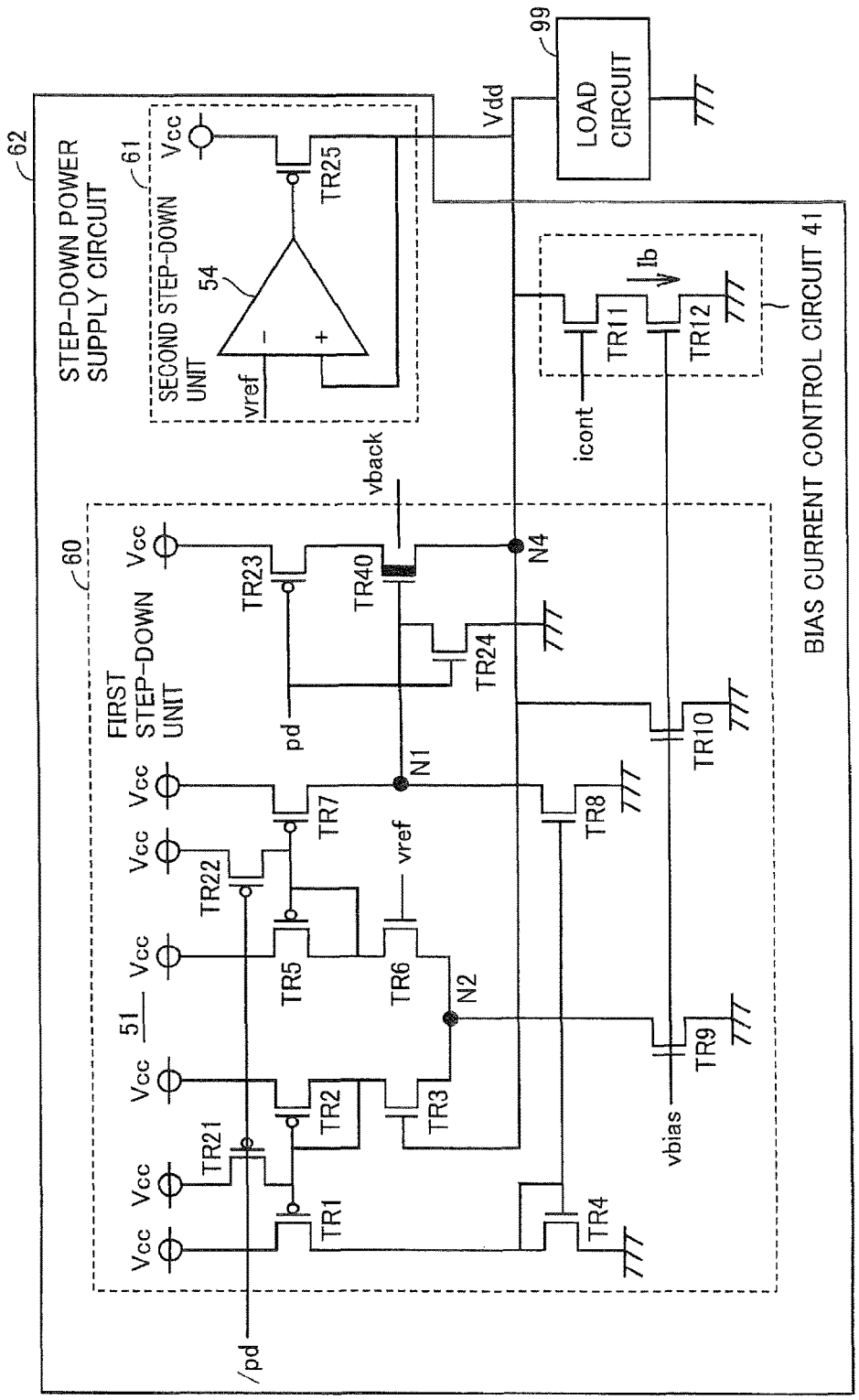
FIG. 8 is a diagram showing a step-down power supply circuit of a second embodiment.

FIG. 8 is a diagram showing a step-down power supply circuit of a second embodiment.

This step-down power supply circuit 62 includes a first step-down unit 60, a second step-down unit 61, and a bias current control circuit 41.

Bias current control circuit 41 is similar to that shown in FIG. 3.

First step-down unit 60 is configured almost similarly to step down unit 50 of FIG. 3. First step-down unit 60 differs from step down unit 50 of FIG. 3 in terms of the following features.

First step-down unit 60 includes a P-channel MOS transistor TR21 provided between respective gates of P-channel MOS transistor TR1 and P-channel MOS transistor TR2 and external power supply voltage node Vcc. To the gate of P-channel MOS transistor TR21, control signal /pd is input. When control signal /pd becomes "L" level, P-channel MOS transistor TR21 is turned on. Accordingly, P-channel MOS transistor TR1 and P-channel MOS transistor TR2 are turned off. Since no current thus flows, the power consumption can be reduced.

First step-down unit 60 includes a P-channel MOS transistor TR22 provided between respective gates of P-channel MOS transistor TR5 and P-channel MOS transistor TR7 and external power supply voltage node Vcc. To the gate of P-channel MOS transistor TR22, control signal /pd is input. When control signal /pd becomes "L" level, P-channel MOS transistor TR22 is turned on. Accordingly, P-channel MOS transistor TR5 and P-channel MOS transistor TR7 are turned off. Since no current thus flows, the power consumption can be reduced.

First step-down unit 60 includes a P-channel MOS transistor TR23 provided between external power supply voltage node Vcc and output MOS transistor TR40. To the gate of P-channel MOS transistor TR23, control signal pd is input.

First step-down unit 60 includes an N-channel MOS transistor TR24 provided between the gate of output transistor TR40 and ground GND. To the gate of N-channel MOS transistor TR24, control signal pd is input.

When control signal pd becomes "H" level, P-channel MOS transistor TR23 is turned off and output MOS transistor TR40 is also turned off. Thus no current flows in output MOS transistor TR40 and therefore the power consumption can be reduced.

In the second embodiment, control signal vbias which is input to the gate of N-channel MOS transistor TR9, the gate of N-channel MOS transistor TR10, and the gate of N-channel MOS transistor TR12 is "H" level in the whole period of the normal operation state as well as a starting period and an ending period of the low power consumption state, and is "L" level except for the starting and ending periods of the low power consumption state, which is similar to the first embodiment. Accordingly, in the low power consumption state, no current flows in these transistors and therefore the power consumption can be reduced.

Figure 9:
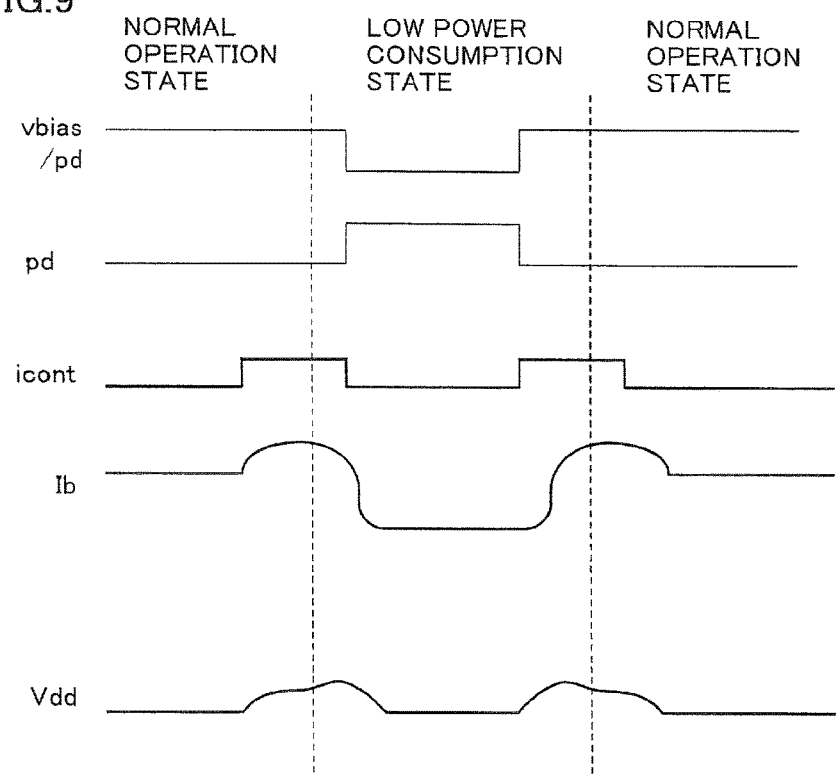
FIG. 9 is a diagram for illustrating an operation, in the second embodiment, when the data processing device makes a transition from the normal operation state to the low power consumption state and when it makes a transition from the low power consumption state to the normal operation state.

In the normal operation state and the starting and ending periods of the low power consumption state, as shown in FIG. 9, system controller SYSC sets control signal vbias to "H" level, sets control signal pd to "L" level, and sets control signal /pd to "H" level. Accordingly, output MOS transistor TR40, P-channel MOS transistors TR1, TR2, TR5, TR7, and N-channel MOS transistors TR9, TR10, TR12 are turned on and the voltage step-down operation is performed in first step-down unit 60.

In the period except for the starting and ending periods of the low power consumption state, as shown in FIG. 9, system controller SYSC sets control signal vbias to "L" level, sets control signal pd to "H" level, and sets control signal /pd to "L" level. Accordingly, output MOS transistor TR40, P-channel MOS transistors TR1, TR2, TR5, TR7, and N-channel MOS transistors TR9, TR10, TR12 are turned off. Then, while the voltage step-down operation is not performed in first step-down unit 60, the leakage current can be reduced.

Second step-down unit 61 has a differential operational amplifier 54 similar to differential operational amplifier 51 of FIG. 3.

Second step-down unit 61 includes an output MOS transistor TR25 of a small size provided between external power supply voltage node Vcc and output node N4 of the step-down power supply circuit. Output MOS transistor TR25 is configured as a P-channel MOS transistor. The output node of differential operational amplifier 54 is connected to the gate of output MOS transistor TR25. Differential operational amplifier 54 applies, to the gate of output MOS transistor TR25, a voltage according to a potential difference between reference voltage Vref and stepped-down voltage Vdd.

Second step-down unit 61 continues operating while the external power supply voltage is supplied to the data processing device, and supplies stepped-down voltage Vdd to load circuit 99. Second step-down unit 61 supplies, even while central processing unit CPU is in the low power consumption state, current which is necessary for the operation of interrupt controller INTC and system controller SYSC for example that are included in load circuit 99 and in the operation state.

As seen from the foregoing, in accordance with the second embodiment, the voltage level of the internal operating voltage for the load circuit can quickly be increased, which is similar to the first embodiment. Moreover, in accordance with the second embodiment, the voltage step-down operation is performed by the first step-down unit and the second step-down unit in the normal operation state, and the voltage step-down operation is performed by only the second step-down unit in the low power consumption state.

Third Embodiment

Figure 10:
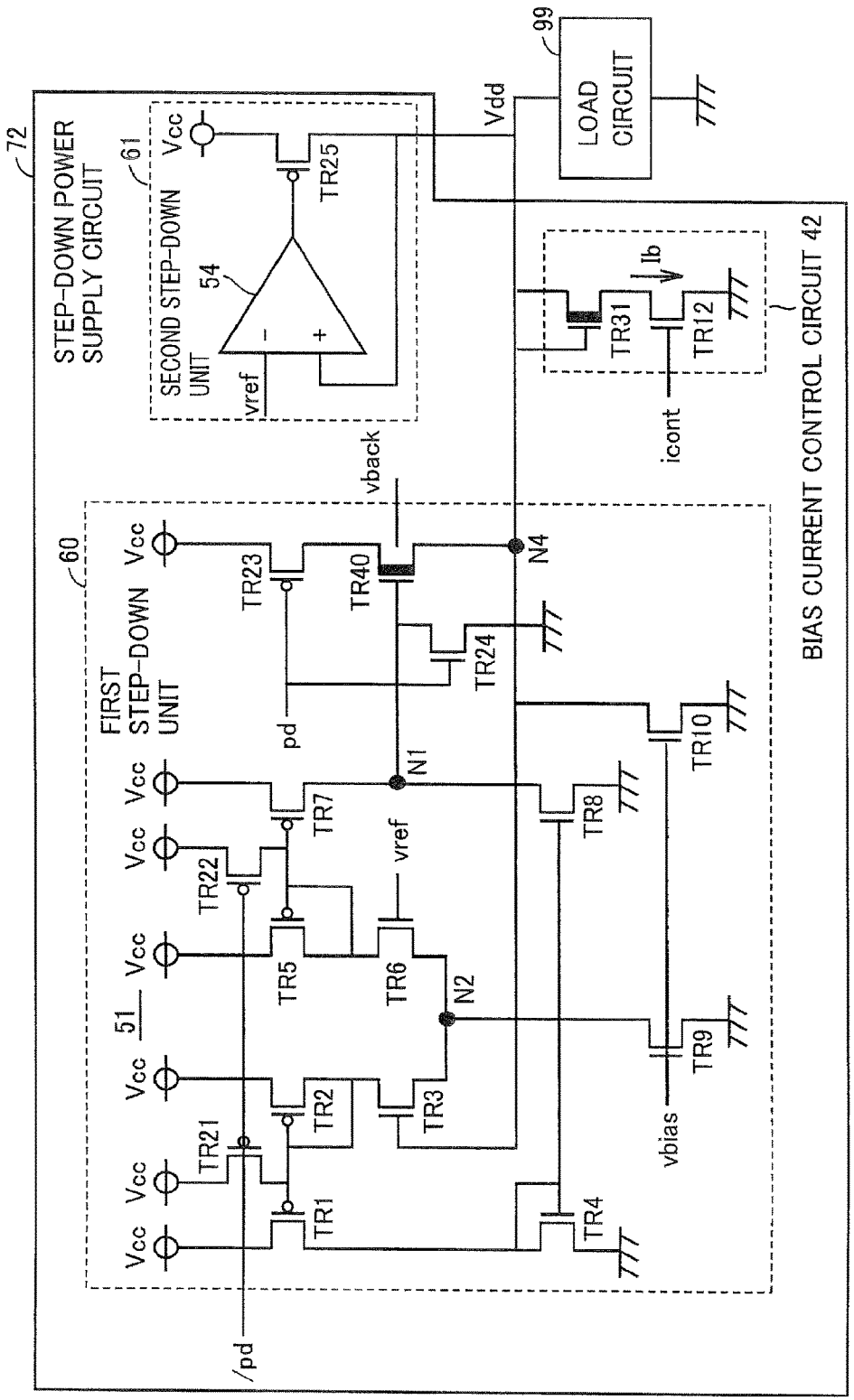
FIG. 10 is a diagram showing a step-down power supply circuit of a third embodiment.

FIG. 10 is a diagram showing a step-down power supply circuit of a third embodiment.

Referring to FIG. 10, this step-down power supply circuit 72 differs from the step-down power supply circuit of FIG. 8 in terms of the bias current control circuit.

A bias current control circuit 42 of FIG. 10 includes an N-channel DMOS transistor TR31 and an N-channel MOS transistor TR12 connected in series between output node N4 of step-down power supply circuit 72 and ground GND.

To the gate of N-channel MOS transistor TR12, bias control signal icont is input. When a transition is made from the normal operation state to the low power consumption state and when a transition is made from the low power consumption state to the normal operation state, the level of bias control signal icont is activated to "H" level prior to the transition and then inactivated to "L" level after a predetermined time from the transition, which is similar to the first and second embodiments.

The gate of N-channel DMOS transistor TR31 is connected to output node N4. When the voltage of output node N4 is high, the ON resistance of N-channel DMOS transistor TR31 is low and bias current Ib flowing in bias current control circuit 42 is accordingly large. On the contrary, when the voltage of output node N4 is low, the ON resistance of N-channel DMOS transistor TR31 is high and bias current Ib flowing in bias current control circuit 42 is accordingly small.

As seen from the foregoing, in accordance with the third embodiment, similar effects to those of the second embodiment are achieved.

Modifications

The present invention is not limited to the above-described embodiments and encompasses modifications as follows.

(1) Transition

Regarding the embodiments of the present invention, a transition from the normal operation state to the low power consumption state and a transition from the low power consumption state to the normal operation state have been described as examples of a change of the operation state which is accompanied by a relatively large change of the amount of current necessary for the operation of functional blocks such as central processing unit in the data processing device. It has also been described that the clock of high-speed clock oscillator HOCO is fed to central processing unit CPU in the normal operation state and the clock is not supplied to central processing unit CPU in the low power consumption state. The present invention, however, is not limited to this.

In general, the change of the operation state which is accompanied by a relatively large change of the amount of current necessary for the operation of functional blocks such as central processing unit in the data processing device is a transition from a state of relatively low power consumption to a state of relatively high power consumption, or a transition from a state of relatively high power consumption to a state of relatively low power consumption.

An example of such a transition between the state of relatively low power consumption and the state of relatively high power consumption may be, instead of the above-described transitions, a change of the frequency of the clock which is output from a clock circuit, caused by a change of the clock frequency division ratio. Specifically, the present invention is also applicable to the case where the clock frequency division ratio is changed so that the clock of a high frequency is fed to central processing unit CPU in the state of relatively high power consumption and the clock of a low frequency is fed to central processing unit CPU in the state of relatively low power consumption.

Another example of such a transition may be a change of the frequency of the clock which is output from the clock circuit, caused by a change of the clock source. Specifically, the present invention is also applicable to the case where the clock from high-speed clock oscillator HOCO is fed to central processing unit CPU in the state of relatively high power consumption and the clock from low-speed clock oscillator LOCO is fed to central processing unit CPU in the state of relatively low power consumption.

It should be construed that embodiments disclosed herein are by way of illustration in all respects, not by way of limitation. It is intended that the scope of the present invention is defined by claims, not by the description above, and encompasses all modifications and variations equivalent in meaning and scope to the claims.

REFERENCE SIGNS LIST 1 data processing system; 2 data processing device; 4 sensor; 6 communication unit; 8 timer; 12 battery; 14 terminal; 18 printed circuit board; 21 bus; 22 memory; 23 flash memory; 24 power supply circuit; 26 clock circuit; 30 ROM; 31 RAM; 41, 42 bias current control circuit; 50 step down unit; 51, 54 differential operational amplifier; 52 step-down power supply circuit; 60 first step-down unit; 61 second step-down unit; 99 load circuit; ADC analog-to-digital conversion unit; CPU central processing unit; DMAC data transfer unit; INTC interrupt controller; LVD low voltage detect circuit; POR power-on reset circuit; SCIO serial communication unit; SYSC system controller; HOCO high-speed clock oscillator; LOCO low-speed clock oscillator; TR1 to TR12, TR21 to TR25, TR31, TR40 MOS transistor

The invention claimed is:

1. A data processing device comprising:
a load circuit including a central processing unit and operated by supplied electric power;
a step-down power supply circuit stepping down an external power supply voltage and including an output node coupled to the load circuit, the step-down power supply circuit including:
  a first step-down unit stepping down the external power supply voltage, and
  a bias current control circuit controlling a magnitude of bias current flowing through an auxiliary path from the output node to a ground, the auxiliary path is separate from a path to the load circuit; and
a control circuit increasing the magnitude of the bias current, prior to issuing of a state transition instruction instructing a change of an operation state of the load circuit by which a relatively large change occurs to an amount of current consumed by the load circuit,
wherein the bias current control circuit includes a first MOSFET (Metal-Oxide Semiconductor Field-Effect Transistor) including a source-drain path as the auxiliary path and a gate coupled to receive a first bias control signal from the control circuit,
wherein when the load circuit makes a transition from a state of relatively high power consumption to a state of relatively low power consumption based on the state transition instruction, the control circuit increases the magnitude of the bias current, prior to issuing of the state transition instruction that instructs the transition, by outputting the first level of the first bias control signal to the gate of the first MOSFET to turn on the first MOSFET, and
wherein after a predetermined time from the transition, the control circuit decreases the magnitude of the bias current by outputting a second level of the first bias control signal to the gate of the first MOSFET to turn off the first MOSFET.

2. The data processing device according to claim 1, wherein the transition is a first transition,
wherein when the load circuit makes a second transition from a state of relatively low power consumption to a state of relatively high power consumption based on the state transition instruction, the control circuit increases the magnitude of the bias current, prior to issuing of the state transition instruction that instructs the second transition, by outputting the first level of the first bias control signal to the gate of the first MOSFET to turn on the first MOSFET, and wherein after a predetermined time from the second transition, the control circuit decreases the magnitude of the bias current by outputting a second level of the first bias control signal to gate of the first MOSFET to turn off the first MOSFET.

3. The data processing device according to claim 1, further comprising:

wherein the first step-down unit includes:

a differential operational amplifier amplifying a potential difference between a reference voltage and the output node;

an output transistor provided between the output node and an external power supply node and including a gate connected to an output of the differential operational amplifier; and a second MOSFET including a source-drain path coupled between the output node and the ground and including a gate coupled to receive a second bias control signal from the control circuit, wherein the control circuit provides a first level of the second bias control signal in the whole period of the state of relatively high power consumption as well as a starting period and an ending period of the state of relatively low power consumption to turn on the second MOSFET, and provides a second level of the second bias control signal except for the starting and ending periods of the state of relatively low power consumption to turn off the second MOSFET.

4. The data processing device according to claim 3, further comprising:

wherein the bias current control circuit further includes a third MOSFET including a source-drain path coupled in series to the source-drain path of the first MOSFET and including a gate coupled to receive the second bias control signal, wherein the third MOSFET turns on by the first level of the second bias control signal and turns off the second level of the second bias control signal.

5. The data processing device according to claim 3, further comprising:

wherein the bias current control circuit further includes a third MOSFET including a source-drain path coupled in series to the source-drain path of the first MOSFET and a gate coupled to the output node.

6. The data processing device according to claim 1, wherein the load circuit includes a component operating at least in the state of relatively low power consumption, wherein the step-down power supply circuit further includes a second step-down unit stepping down the external power supply voltage, wherein the first step-down unit operates only in the state of relatively high power consumption, and wherein the second step-down unit operates in the state of relatively high power consumption and the state of relatively low power consumption.

7. The data processing device according to claim 3, further comprising:

wherein a current control by the control circuit is according to the first transition.

8. The data processing device according to claim 1, further comprising:

wherein the central processing unit includes a processor, and the first step-down unit includes a first step-down circuit.

9. A data processing system comprising:

a battery;

a sensor unit;

a timer unit;

a communication unit; and a data processing device operated by a power supply voltage supplied from the battery, boosted at a predetermined time interval by the timer to make a first transition from a state of relatively low power consumption to a state of relatively high power consumption in response to an output of the timer unit and to perform a processing on output signals from the sensor, outputting the processed data to the communication unit, making a second transition from the state of relatively high power consumption to the state of relatively low power consumption after outputting the processed data, wherein the data processing device includes:

a load circuit including a central processing unit and operated by supplied electric power, a step-down power supply circuit stepping down the power supply voltage from the battery and including an output node coupled to the load circuit, the step-down power supply circuit including:

a first step-down unit stepping down the power supply voltage, and a bias current control circuit controlling a magnitude of bias current flowing through an auxiliary path from the output node to a ground, the auxiliary path is separate from a path to the load circuit; and a control circuit increasing the magnitude of the bias current, prior to issuing of a state transition instruction instructing a change of an operation state of the load circuit by which a relatively large change occurs to an amount of current consumed by the load circuit, wherein the bias current control circuit includes a first MOSFET including a source-drain path as the auxiliary path and a gate coupled to receive a first bias control signal from the control circuit, wherein when the load circuit makes the second transition, the control circuit increases the magnitude of the bias current, prior to issuing of the state transition instruction which instructs the second transition, by outputting the first level of the first bias control signal to the gate of the first MOSFET to turn on the first MOSFET.

10. The data processing system according to claim 9, wherein when the load circuit makes the first transition, the control circuit increases the magnitude of the bias current, prior to issuing of the state transition instruction which instructs the first transition, by outputting the first level of the first bias control signal to the gate of the first MOSFET to turn on the first MOSFET.

11. A data processing device comprising:

a step-down power supply circuit stepping down an external power supply voltage and including an output node coupled to a load circuit, the step-down power supply circuit including:

a bias current control circuit controlling a magnitude of bias current flowing through an auxiliary path from the output node to a ground, the auxiliary path is separate from a path to the load circuit; and a control circuit increasing the magnitude of the bias current, prior to issuing of a state transition instruction instructing a change of an operation state of the load circuit by which a relatively large change occurs to an amount of current consumed by the load circuit, wherein the bias current control circuit includes at least a first transistor being controlled by a first bias control signal from the control circuit, wherein when the load circuit makes a transition from a state of relatively high power consumption to a state of relatively low power consumption based on the state transition instruction, the control circuit increases the magnitude of the bias current, prior to issuing of the state transition instruction that instructs the transition, by outputting the first level of the first bias control signal to control the first transistor to turn on the first transistor, and wherein after a predetermined time from the transition, the control circuit decreases the magnitude of the bias current by outputting a second level of the first bias control signal to control the first transistor to turn off the first transistor.

12. The data processing device according to claim 11, wherein the transition is a first transition, wherein when the load current makes a second transition from a state of relatively low power consumption to a state of relatively high power consumption based on the state transition instruction, the control circuit increases the magnitude of the bias current, prior to issuing of the state transition instruction that instructs the second transition, by outputting the first level of the first bias control signal to control the first transistor to turn on the first transistor, and wherein after a predetermined time from the second transition, the control circuit decreases the magnitude of the bias current by outputting a second level of the first bias control signal to the first transistor to turn off the first transistor.

13. The data processing device according to claim 11, further comprising:

wherein the first step-down unit includes:

a differential operational amplifier amplifying a potential difference between a reference voltage and the output node;

an output transistor provided between the output node and an external power supply node and including a gate connected to an output of the differential operational amplifier; and a second transistor being controlled by a second bias control signal from the control unit, wherein the control circuit provides a first level of the second bias control signal in the whole period of the state of relatively high power consumption as well as a starting period and an ending period of the state of relatively low power consumption to turn on the second transistor, and provides a second level of the second bias control signal except for the starting and ending periods of the state of relatively low power consumption to turn off the second transistor.

14. The data processing device according to claim 13, further comprising:

wherein the bias current control circuit further includes a third transistor including a connection to the first transistor, the third transistor being controlled by the second bias control signal, wherein the third transistor turns on by the first level of the second bias control signal and turns off the second level of the second bias control signal.

15. The data processing device according to claim 13, further comprising:

wherein the bias current control circuit further includes a third transistor including a connection to the first transistor and a control terminal coupled to the output node.

16. The data processing device according to claim 11, wherein the step-down power supply circuit further includes a second step-down unit stepping down the external power supply voltage, wherein the first step-down unit operates only in the state of relatively high power consumption, and wherein the second step-down unit operates in the state of relatively high power consumption and the state of relatively low power consumption.

17. The data processing device according to claim 13, further comprising:

wherein a current control by the control circuit is according to the first transition.

18. The data processing device according to claim 1, further comprising:

wherein the central processing unit includes a processor, and the first step-down unit includes a first step-down circuit.

19. The data processing device according to claim 11, wherein the bias current control circuit includes the first transistor comprising a first MOSFET (Metal-Oxide Semiconductor Field-Effect Transistor) including a source-drain path as the auxiliary path and a gate coupled to receive a first bias control signal from the control circuit, wherein when the load circuit makes a transition from a state of relatively high power consumption to a state of relatively low power consumption, the control circuit increases the magnitude of the bias current, prior to the transition, by outputting the first level of the first bias control signal to the gate of the first MOSFET to turn on the first MOSFET, and wherein after a predetermined time from the transition, the control circuit decreases the magnitude of the bias current by outputting a second level of the first bias control signal to the gate of the first MOSFET to turn off the first MOSFET.

20. The data processing device according to claim 1, wherein the control circuit controls the transition from the state of relatively high power consumption being a normal operation state to the state of relatively low power consumption, by increasing the magnitude of the bias current prior to issuing the state transition instruction that instructs the transition.

21. The data processing device according to claim 1, wherein the load circuit including the central processing unit requests the control circuit to issue the state transition instruction, and in response to the request the control circuit increases the magnitude of the bias current prior to the control circuit issuing the state transition instruction to the load circuit.

22. The data processing device according to claim 1, wherein in response to a request from the load circuit, the control circuit increases the magnitude of the bias current and issues the state transition instructions to the load circuit a predetermined time after increasing the magnitude of the bias current.

* * * * *